(12) United States Patent
Chien

(10) Patent No.: US 9,076,801 B2
(45) Date of Patent: Jul. 7, 2015

(54) MODULE IC PACKAGE STRUCTURE

(71) Applicant: AZUREWAVE TECHNOLOGIES, INC., New Taipei (TW)

(72) Inventor: Huang-Chan Chien, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 14/078,819

(22) Filed: Nov. 13, 2013

(65) Prior Publication Data

US 2015/0130034 A1  May 14, 2015

(51) Int. Cl.
*H01L 23/552* (2006.01)
*H01L 23/60* (2006.01)
*H01L 23/00* (2006.01)

(52) U.S. Cl.
CPC .............. *H01L 23/552* (2013.01); *H01L 24/96* (2013.01); *H01L 23/60* (2013.01); *H01L 2225/06537* (2013.01); *H01L 2924/3025* (2013.01)

(58) Field of Classification Search
CPC .................. H01L 23/552; H01L 23/60; H01L 2924/3025; H01L 2225/06537
See application file for complete search history.

(56) References Cited

U.S. PATENT DOCUMENTS

| 2010/0059785 | A1* | 3/2010 | Lin et al. | 257/99 |
| 2011/0304015 | A1* | 12/2011 | Kim et al. | 257/532 |
| 2012/0193770 | A1* | 8/2012 | Yamada et al. | 257/659 |
| 2013/0256848 | A1* | 10/2013 | Kawabata et al. | 257/659 |
| 2013/0257462 | A1* | 10/2013 | Ding et al. | 324/705 |
| 2013/0271928 | A1* | 10/2013 | Shimamura et al. | 361/748 |

* cited by examiner

*Primary Examiner* — Phat X Cao
(74) *Attorney, Agent, or Firm* — Li & Cai Intellectual Property (USA) Office

(57) ABSTRACT

A module IC package structure includes a substrate unit, an electronic unit, a package unit and a shielding unit. The substrate unit includes a circuit substrate and a grounding layer disposed inside the circuit substrate. The grounding layer is exposed from the outer surrounding peripheral surface of the circuit substrate. The electronic unit includes a plurality of electronic components disposed on the circuit substrate. The electronic components are electrically connected to the grounding layer through the circuit substrate. The package unit includes a package gel body disposed on the circuit substrate to enclose the electronic components. The shielding unit includes a metal shielding layer disposed on the outer surface of the package gel body and the surrounding peripheral surface of the circuit substrate. The metal shielding layer directly contacts the grounding layer, thus the electronic components are electrically connected to the metal shielding layer through the grounding layer.

7 Claims, 9 Drawing Sheets

MODULE IC PACKAGE STRUCTURE

BACKGROUND OF THE INVENTION

1. Field of the Invention

The instant disclosure relates to a module IC (Integrated Circuit) package structure and a method for manufacturing thereof, and more particularly to a module IC package structure with electrical shielding function and a method for manufacturing thereof.

2. Description of Related Art

As integrated circuit technology has been rapidly developing, a variety of devices using the technology are developed continuously. Because the functions of the devices are rapidly added, most devices are implemented in a modular way. However, while the functions of the devices can be increased by integrating a lot of functional modules, the design of a multiple function device with small dimensions is still difficult.

In the semiconductor manufacturing process, a high level technology is used to manufacture a small chip or component. Therefore, the module manufacturer can design a functional module with small dimensions, and the device can be efficiently and fully developed. Currently, most modules use the printed circuit board (PCB), Flame Retardant 4 (FR-4), or Bismaleimide Triazine (BT) substrate as a carrier. All chips and components are mounted onto the surface of the carrier by using a surface mounting technology (SMT). Therefore, the substrate is merely used as a carrier and is used for connecting the circuit. The structure of the substrate is a multiple-layered structure and is only used for the circuit layout.

Following the development of radio frequency technology, wireless communication systems are becoming more powerful and their performance increases. Demands on these systems are low weight, small dimensions, high quality, low energy-consumption high reliability, and low manufacturing costs. Another important function of wireless communication systems is the electric shielding of radiation emitted by their components in order to minimize interference of this radiation with other electronic devices or components.

However, up to the present the production of the shielding structures adds disproportional costs and time expenditure to the total manufacturing costs. In many cases, the shielding structure is realized as a sheet steel casing around the wireless device or circuit module, necessitating the manufacture of costly dies for each shielding structure shape. Another currently employed method is to produce the casings by metal casting. In this case, each shape to be cast requires the manufacture of a specific casting mold which involves manual work, leading to high costs. Furthermore, the assembly of the metal casings and the circuit modules is usually performed manually thus further increases costs.

SUMMARY OF THE INVENTION

One aspect of the instant disclosure relates to a module IC package structure with electrical shielding function and a method for manufacturing thereof.

One of the embodiments of the instant disclosure provides a module IC package structure with electrical shielding function, comprising: a substrate unit, an electronic unit, a package unit and a shielding unit. The substrate unit includes a circuit substrate having an outer surrounding peripheral surface, a grounding layer disposed inside the circuit substrate and enclosed by the circuit substrate, and an inner conductive structure disposed inside the circuit substrate and electrically connected to the grounding layer, wherein the inner conductive structure includes a plurality of inner conductive layers, and each inner conductive layer has a first end directly contacting the grounding layer and a second end opposite to the first end and exposed from the outer surrounding peripheral surface of the circuit substrate. The electronic unit includes a plurality of electronic components disposed on the circuit substrate and electrically connected to the circuit substrate, wherein the electronic components are electrically connected to the grounding layer through the circuit substrate. The package unit includes a package gel body disposed on the circuit substrate to enclose the electronic components. The shielding unit includes a metal shielding layer disposed on the outer surface of the package gel body and the surrounding peripheral surface of the circuit substrate, wherein the metal shielding layer directly contacts the second end of each inner conductive layer, and the grounding layer is electrically connected to the metal shielding layer through the inner conductive structure.

More precisely, the substrate unit includes a plurality of first half through holes disposed on the outer surrounding peripheral surface of the circuit substrate and passing through the circuit substrate, the package unit includes a plurality of second half through holes passing through the package gel body and respectively communicated with the first half through holes, the second end of each inner conductive layer is exposed from the corresponding first half through hole, and the inner surfaces of the first half through holes and the inner surfaces of the second half through holes are covered with the metal shielding layer. Furthermore, the package gel body has an outer surrounding peripheral surface, the outer surrounding peripheral surface of the package gel body and the outer surrounding peripheral surface of the circuit substrate are cutting surfaces, and the outer surrounding peripheral surface of the package gel body are flushed with the outer surrounding peripheral surface of the circuit substrate.

Another one of the embodiments of the instant disclosure provides a module IC package structure with electrical shielding function, comprising: a substrate unit, an electronic unit, a package unit and a shielding unit. The substrate unit includes a circuit substrate having an outer surrounding peripheral surface and a grounding layer disposed inside the circuit substrate, wherein the grounding layer is exposed from the outer surrounding peripheral surface of the circuit substrate. The electronic unit includes a plurality of electronic components disposed on the circuit substrate and electrically connected to the circuit substrate, wherein the electronic components are electrically connected to the grounding layer through the circuit substrate. The package unit includes a package gel body disposed on the circuit substrate to enclose the electronic components. The shielding unit includes a metal shielding layer disposed on the outer surface of the package gel body and the surrounding peripheral surface of the circuit substrate, wherein the metal shielding layer directly contacts the grounding layer that is exposed from the outer surrounding peripheral surface of the circuit substrate, and the electronic components are electrically connected to the metal shielding layer through the grounding layer.

More precisely, the substrate unit includes a plurality of first half through holes disposed on the outer surrounding peripheral surface of the circuit substrate and passing through the circuit substrate, the package unit includes a plurality of second half through holes passing through the package gel body and respectively communicated with the first half through holes, the grounding layer is exposed from the first half through holes, and the inner surfaces of the first half through holes and the inner surfaces of the second half through holes are covered with the metal shielding layer. Furthermore, the package gel body has an outer surrounding peripheral surface, the outer surrounding peripheral surface of the package gel body and the outer surrounding peripheral surface of the circuit substrate are cutting surfaces, and the outer surrounding peripheral surface of the package gel body are flushed with the outer surrounding peripheral surface of the circuit substrate.

Yet another one of the embodiments of the instant disclosure provides a method for manufacturing a module IC package structure with electrical shielding function, comprising: providing an initial substrate including a plurality of substrate units connected with each other and arranged as a matrix, wherein each substrate unit includes a circuit substrate, a grounding layer disposed inside the circuit substrate and enclosed by the circuit substrate, and an inner conductive structure disposed inside the circuit substrate and electrically connected to the grounding layer, wherein the inner conductive structure includes a plurality of inner conductive layers, and each inner conductive layer has a first end directly contacting the grounding layer and a second end opposite to the first end; respectively placing a plurality of electronic units on the circuit substrates of the substrate units, wherein each electronic unit includes a plurality of electronic components disposed on the corresponding circuit substrate and electrically connected to the corresponding circuit substrate, and the electronic components of each electronic unit are electrically connected to the corresponding grounding layer through the corresponding circuit substrate; forming an initial package unit on the initial substrate to enclose the electronic units, wherein the initial package unit includes a plurality of package gel bodies connected with each other, and each package gel body is disposed on the corresponding circuit substrate to enclose the corresponding electronic components; forming a plurality of passing holes to pass through the initial substrate and the initial package unit, for exposing the second end of each inner conductive layer; cutting the initial substrate and the initial package unit along the passing holes, for separating the substrate units from each other and the package gel bodies from each other; and then forming a plurality of metal shielding layers, wherein each metal shielding layer is disposed on the outer surface of the corresponding package gel body and a surrounding peripheral surface of the corresponding circuit substrate, and each metal shielding layer directly contacts the second end of each inner conductive layer of the corresponding substrate unit.

More precisely, the passing holes are formed by drilling. Furthermore, the substrate unit includes a plurality of first half through holes disposed on the outer surrounding peripheral surface of the circuit substrate and passing through the circuit substrate, the package gel body includes a plurality of second half through holes passing through the package gel body and respectively communicated with the first half through holes, the second end of each inner conductive layer is exposed from the corresponding first half through hole, and the inner surfaces of the first half through holes and the inner surfaces of the second half through holes are covered with the metal shielding layer. Moreover, the package gel body has an outer surrounding peripheral surface, the outer surrounding peripheral surface of the package gel body and the outer surrounding peripheral surface of the circuit substrate are cutting surfaces, and the outer surrounding peripheral surface of the package gel body are flushed with the outer surrounding peripheral surface of the circuit substrate.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

[First Embodiment]

Figure 1:
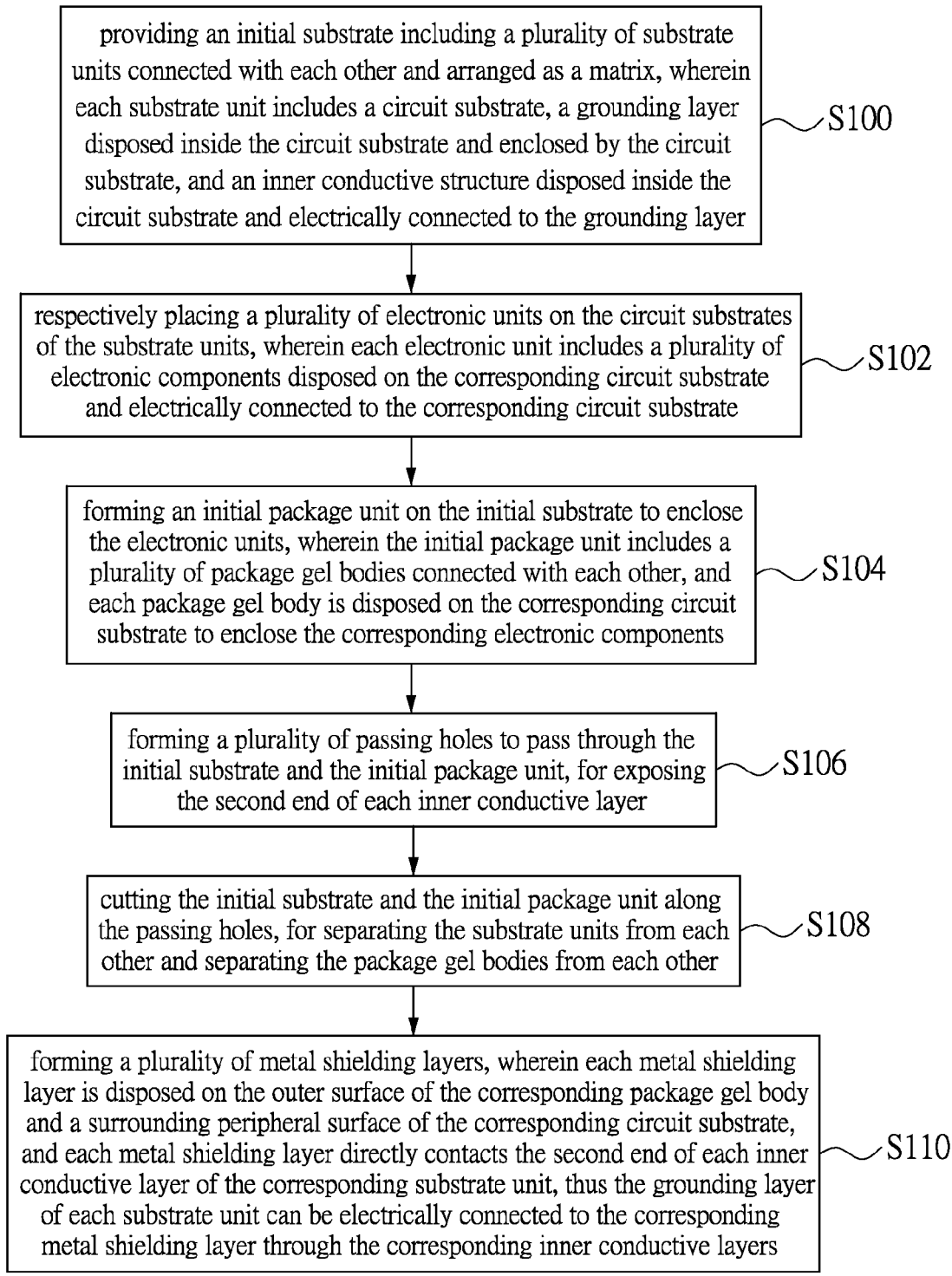
FIG. 1 shows a flowchart of the method for manufacturing a module IC package structure with electrical shielding function according to the first embodiment of the instant disclosure.
Figure 2:
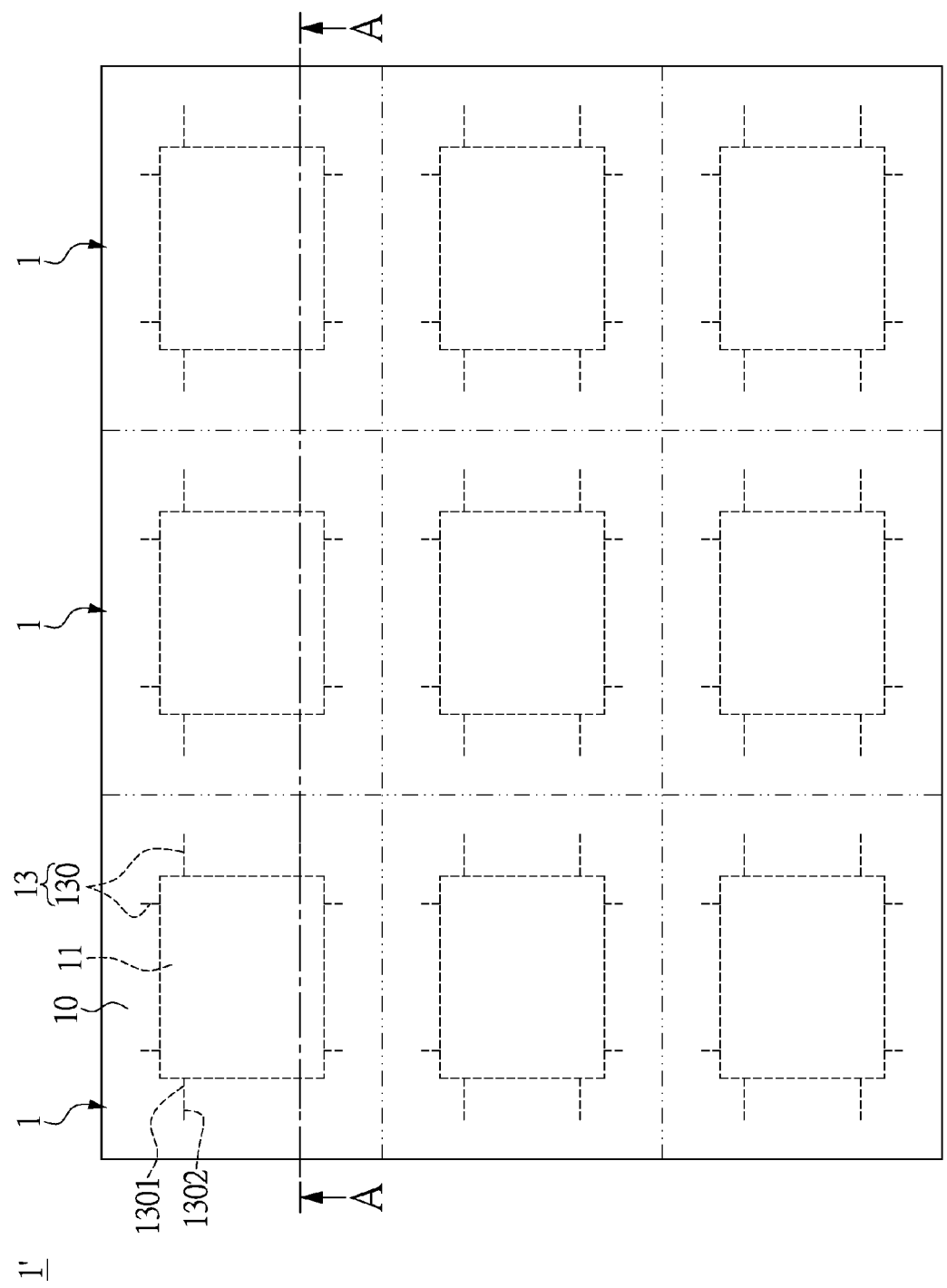
FIG. 2 shows a top, schematic view of the step S100 of the method for manufacturing a module IC package structure with electrical shielding function according to the first embodiment of the instant disclosure.
Figure 3:
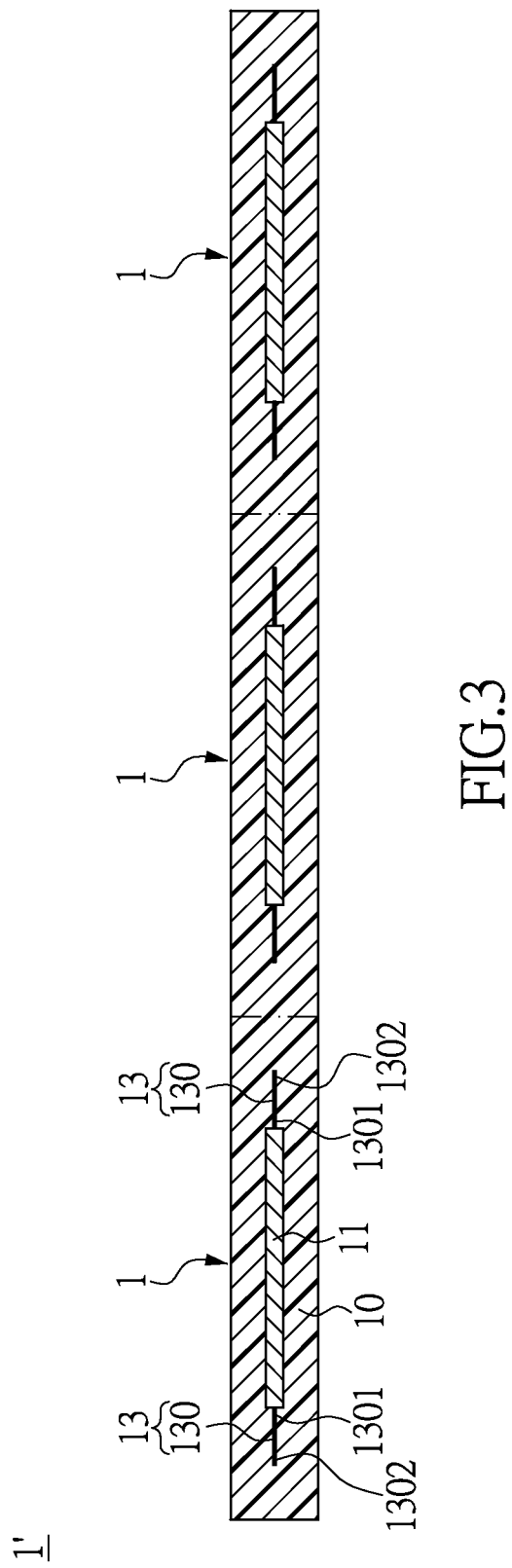
FIG. 3 shows a cross-sectional view taken along the section line A-A of FIG. 2.

Referring to FIG. 1 to FIG. 10, the first embodiment of the instant disclosure provides a method for manufacturing a module IC package structure Z with electrical shielding function, comprising the following steps:

First, step S100 is that: referring to FIG. 1, FIG. 2 and FIG. 3, providing an initial substrate 1' including a plurality of substrate units 1 connected with each other and arranged as a matrix, wherein each substrate unit 1 includes a circuit substrate 10, a grounding layer 11 (such as a lamellar ground layer) disposed inside the circuit substrate 10 and enclosed by the circuit substrate 10, and an inner conductive structure 13 disposed inside the circuit substrate 10 and electrically connected to the grounding layer 11. In addition, the inner conductive structure 13 includes a plurality of inner conductive layers 130 (such as a strip conductive layer), and each inner conductive layer 130 has a first end 1301 directly contacting the grounding layer 10 and a second end 1302 opposite to the first end 1301. For example, the substrate unit 1 may be a multilayer circuit board structure composed of many stacked layers, and the grounding layer 11 is one of the stacked layers of the multilayer circuit board structure. Thus, the grounding layer 11 may be a topmost layer of the multilayer circuit board structure, and the topmost layer is disposed on the top side of the circuit substrate 10, but it is merely an example and is not meant to limit the instant disclosure.

Figure 4:
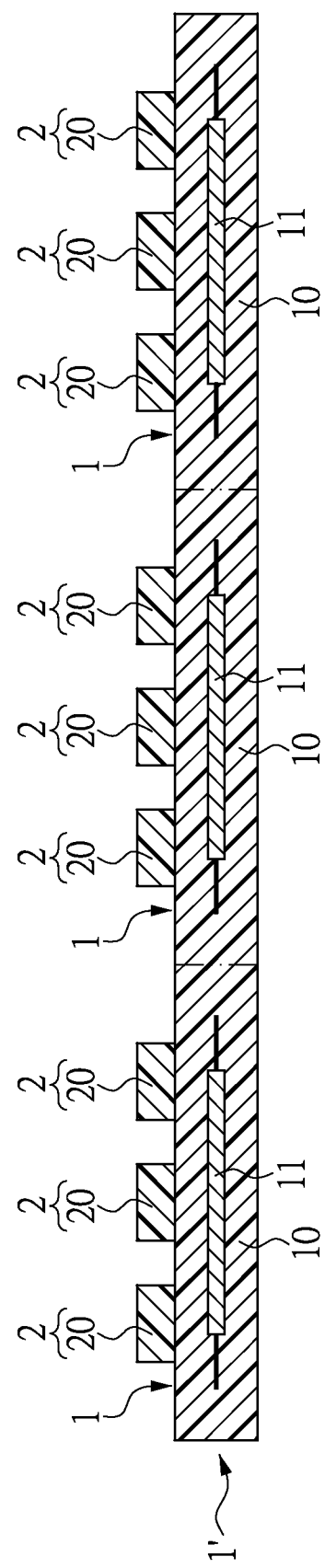
FIG. 4 shows a cross-sectional, schematic view of the step S102 of the method for manufacturing a module IC package structure with electrical shielding function according to the first embodiment of the instant disclosure.

Then, step S102 is that: referring to FIG. 1, FIG. 3 and FIG. 4, respectively placing a plurality of electronic units 2 on the circuit substrates 10 of the substrate units 1. In addition, each electronic unit 2 includes a plurality of electronic components 20 (such as passive components or active components) disposed on the corresponding circuit substrate 10 and electrically connected to the corresponding circuit substrate 10, and the electronic components 20 of each electronic unit 2 are electrically connected to the corresponding grounding layer 11 through the corresponding circuit substrate 10. For example, the circuit substrate 10 as a multilayer circuit board structure includes at least one conductive structure disposed inside the circuit substrate 10 and electrically connected between the electronic component 20 and the grounding layer 11, thus the electronic components 20 of each electronic unit 2 can be electrically connected to the corresponding grounding layer 11 through the corresponding circuit substrate 10.

Figure 5:
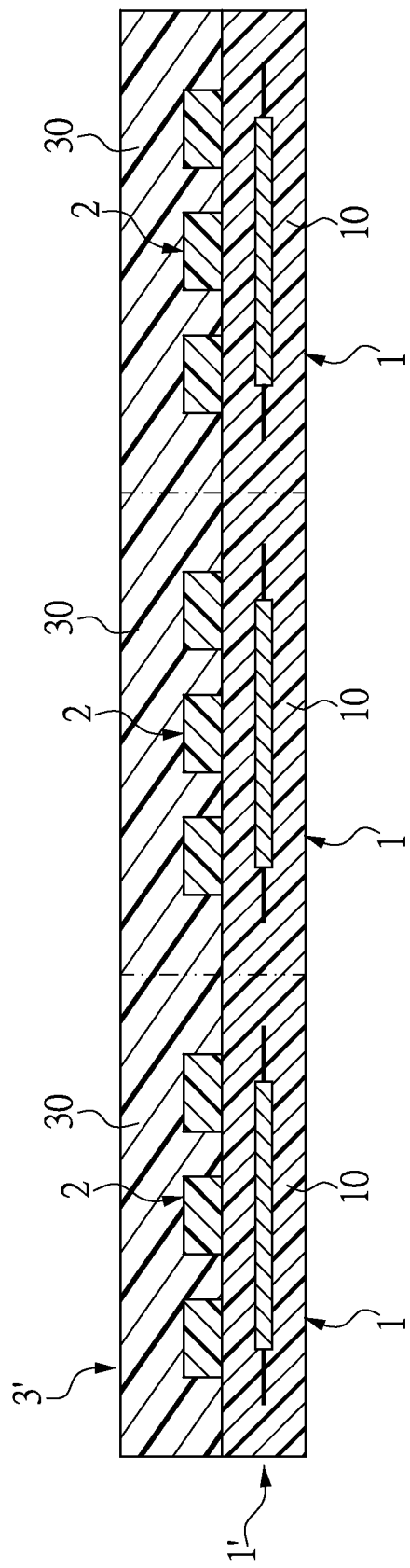
FIG. 5 shows a cross-sectional, schematic view of the step S104 of the method for manufacturing a module IC package structure with electrical shielding function according to the first embodiment of the instant disclosure.
Figure 6:
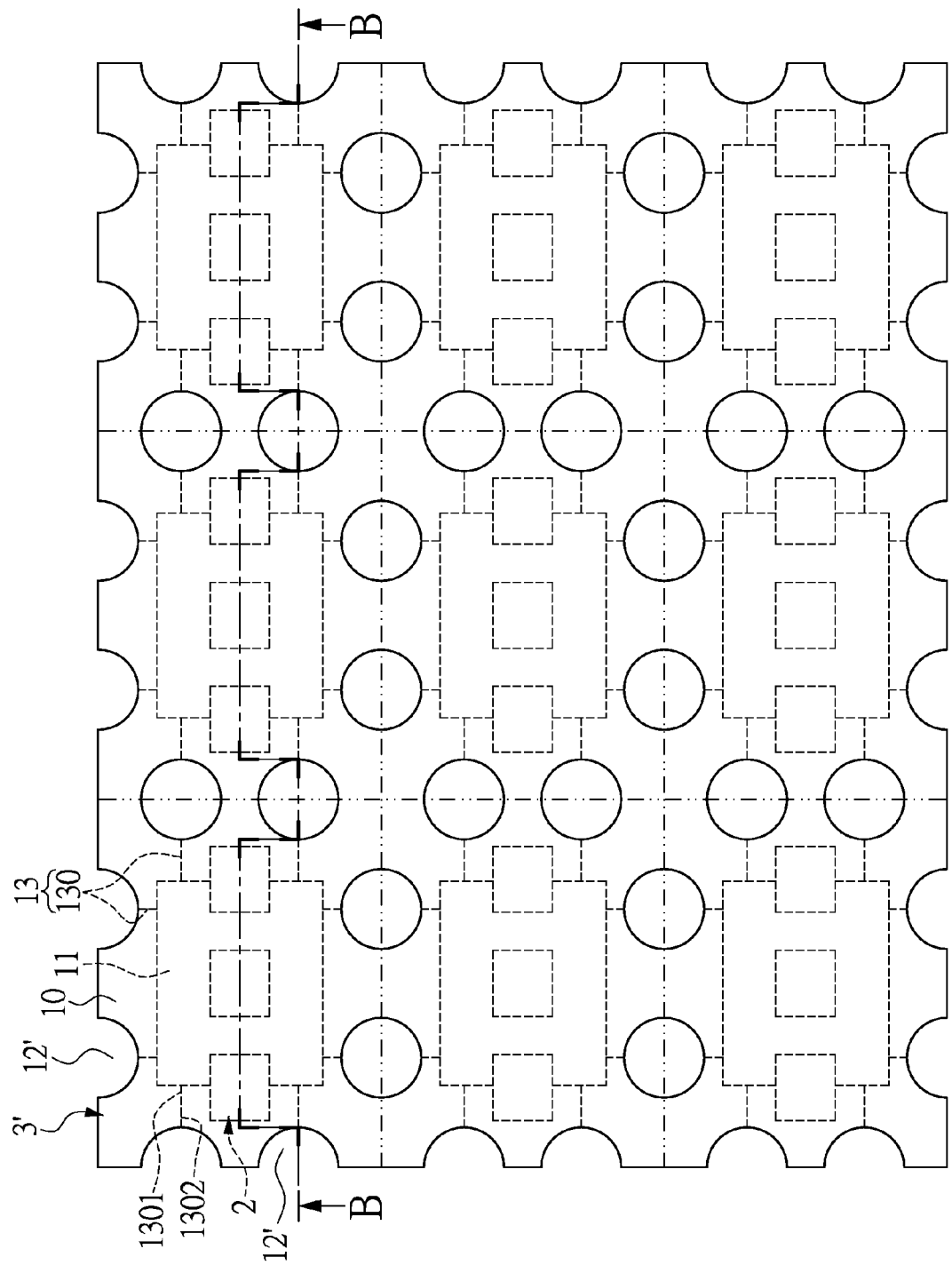
FIG. 6 shows a top, schematic view of the step S106 of the method for manufacturing a module IC package structure with electrical shielding function according to the first embodiment of the instant disclosure.

Next, step S104 is that: referring to FIG. 1, FIG. 4 and FIG. 5, forming an initial package unit 3' on the initial substrate 1' to enclose the electronic units 2. In addition, the initial package unit 3' includes a plurality of package gel bodies 30 connected with each other, and each package gel body 30 is disposed on the corresponding circuit substrate 10 to enclose the corresponding electronic components 20. For example, the package gel body 30 may be an opaque resin body made of silicone or epoxy.

Afterward, step S106 is that: referring to FIG. 1, FIG. 5, FIG. 6 and FIG. 7, forming a plurality of passing holes 12' to pass through the initial substrate 1' and the initial package unit 3', for exposing the second end 1302 of each inner conductive layer 13. For example, the passing holes 12' can be formed by drilling, such as laser drilling.

Figure 7:
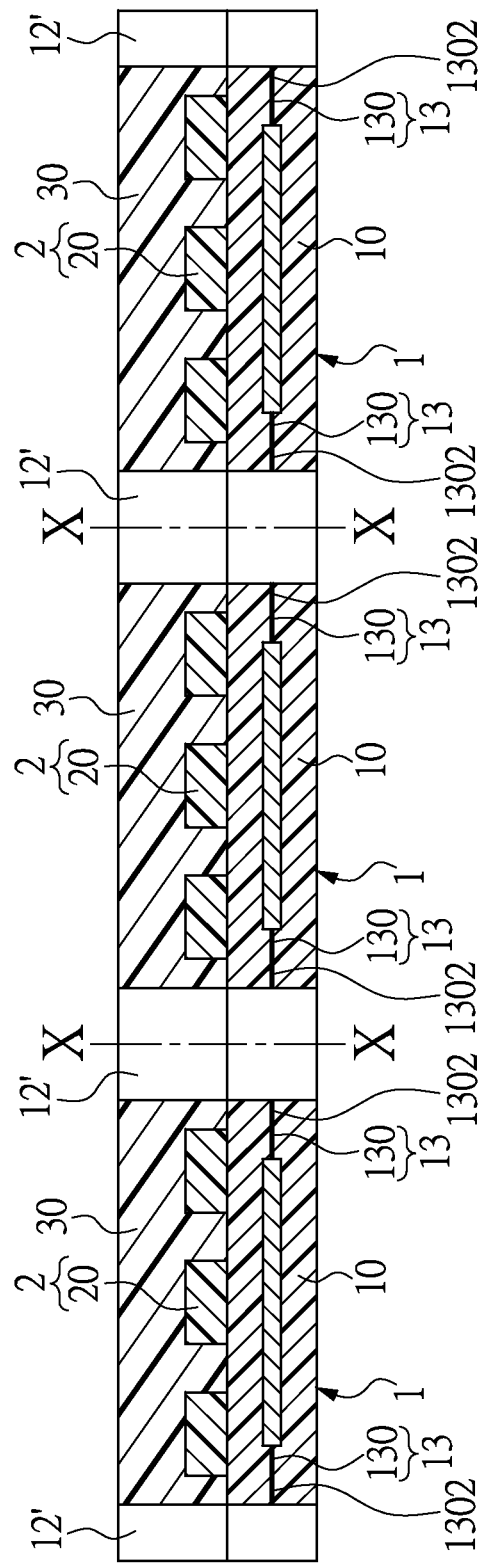
FIG. 7 shows a cross-sectional view taken along the section line B-B of FIG. 6.
Figure 8:
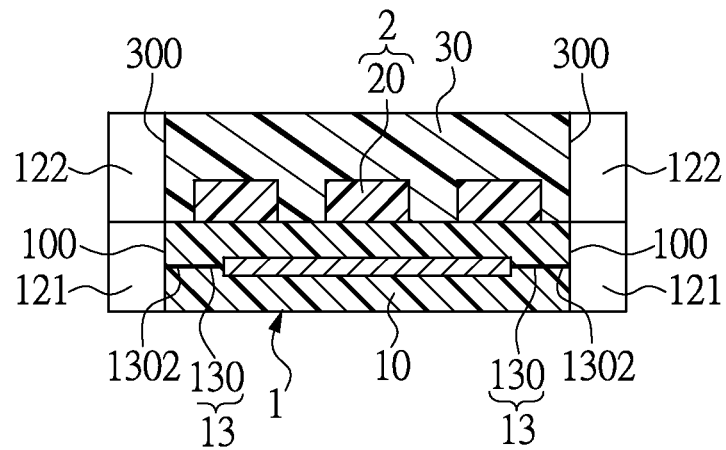
FIG. 8 shows a cross-sectional, schematic view of the step S108 of the method for manufacturing a module IC package structure with electrical shielding function according to the first embodiment of the instant disclosure.

Subsequent, step S108 is that: referring to FIG. 1, FIG. 7 and FIG. 8, cutting the initial substrate 1' and the initial package unit 3' along the passing holes 12' (i.e., along the cutting line X-X as shown in FIG. 7), for separating the substrate units 1 from each other and separating the package gel bodies 30 from each other. More precisely, referring to FIG. 8, the substrate unit 1 includes a plurality of first half through holes 121 disposed on the outer surrounding peripheral surface 100 of the circuit substrate 10 and passing through the circuit substrate 10. The package gel body 30 includes a plurality of second half through holes 122 passing through the package gel body 30 and respectively communicated with the first half through holes 121, and the second end 1302 of each inner conductive layer 130 is exposed from the corresponding first half through hole 121. In addition, the package gel body 30 has an outer surrounding peripheral surface 300, the outer surrounding peripheral surface 300 of the package gel body 30 and the outer surrounding peripheral surface 100 of the circuit substrate 10 are cutting surfaces, and the outer surrounding peripheral surface 300 of the package gel body 30 are flushed with the outer surrounding peripheral surface 100 of the circuit substrate 10.

Finally, step S110 is that: referring to FIG. 1, FIG. 8, FIG. 9 and FIG. 10, forming a plurality of metal shielding layers 40. In addition, each metal shielding layer 40 is disposed on the outer surface of the corresponding package gel body 30 and a surrounding peripheral surface 100 of the corresponding circuit substrate 10, and each metal shielding layer 40 directly contacts the second end 1302 of each inner conductive layer 130 of the corresponding substrate unit 1, thus the grounding layer 11 of each substrate unit 1 can be electrically connected to the corresponding metal shielding layer 40 through the corresponding inner conductive layers 130. More precisely, the inner surfaces of the first half through holes 121 and the inner surfaces of the second half through holes 122 are covered with the metal shielding layer 40.

Figure 9:
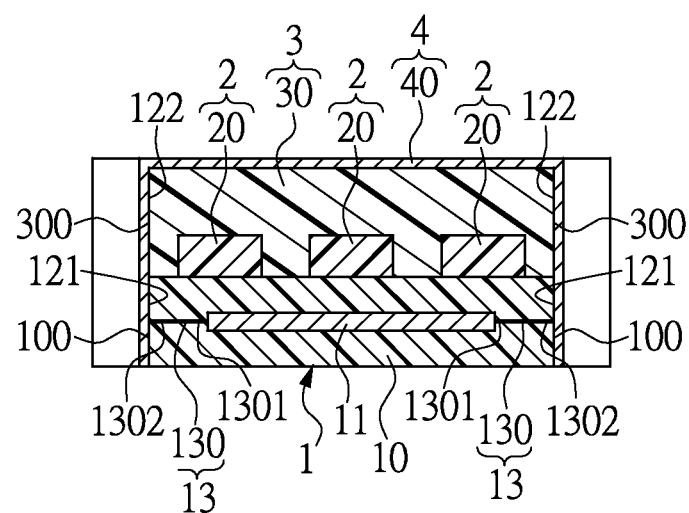
FIG. 9 shows a cross-sectional, schematic view of the step S110 of the method for manufacturing a module IC package structure with electrical shielding function according to the first embodiment of the instant disclosure.
Figure 10:
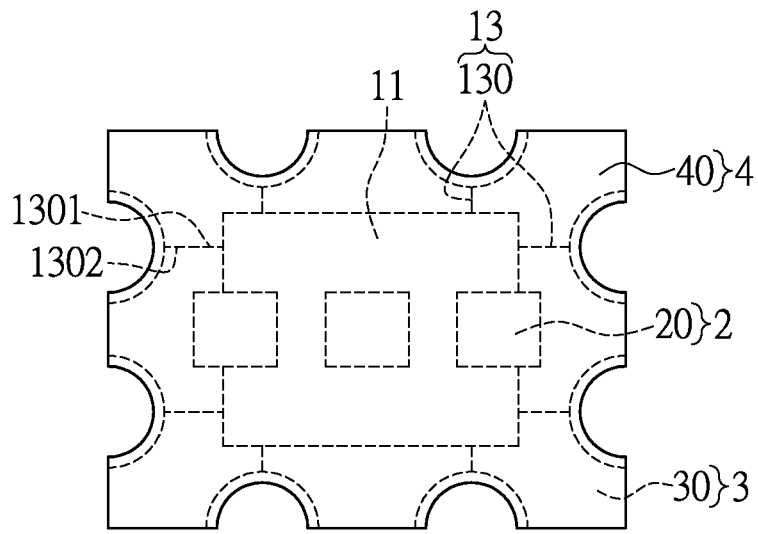
FIG. 10 shows a top, schematic view of the step S110 of the method for manufacturing a module IC package structure with electrical shielding function according to the first embodiment of the instant disclosure.

In conclusion, referring to FIG. 9 and FIG. 10, according to the above-mentioned manufacture method, the first embodiment of the instant disclosure provides a module IC package structure Z with electrical shielding function, comprising: a substrate unit 1, an electronic unit 2, a package unit 3 and a shielding unit 4.

First, the substrate unit 1 includes a circuit substrate 10 having an outer surrounding peripheral surface 100, a grounding layer 11 disposed inside the circuit substrate 10 and enclosed by the circuit substrate 10, and an inner conductive structure 13 disposed inside the circuit substrate 10 and electrically connected to the grounding layer 11. In addition, the inner conductive structure 13 includes a plurality of inner conductive layers 130, and each inner conductive layer 130 has a first end 1301 directly contacting the grounding layer 11 and a second end 1302 opposite to the first end 1301 and exposed from the outer surrounding peripheral surface 100 of the circuit substrate 10.

Moreover, the electronic unit 2 includes a plurality of electronic components 20 disposed on the circuit substrate 10 and electrically connected to the circuit substrate 10, and the electronic components 20 are electrically connected to the grounding layer 11 through the circuit substrate 10. For example, the electronic component 20 may be may be a resistance, a capacitor, an inductance, a function chip having a predetermined function or a semiconductor chip having a predetermined function etc., but it is merely an example and is not meant to limit the instant disclosure.

Furthermore, the package unit 3 includes a package gel body 30 disposed on the circuit substrate 10 to enclose the electronic components 20, and the shielding unit 4 includes a metal shielding layer 40 disposed on the outer surface of the package gel body 30 and the surrounding peripheral surface 100 of the circuit substrate 10, thus the package gel body 30 and the surrounding peripheral surface 100 of the circuit substrate 10 can be enclosed by the metal shielding layer 40. Whereby, the metal shielding layer 40 can directly contact the second end 1302 of each inner conductive layer 130, thus the grounding layer 11 can be electrically connected to the metal shielding layer 40 through the inner conductive layers 130 of the inner conductive structure 13. For example, the metal shielding layer 40 may be a conductive spray layer formed by spraying, a conductive sputtering layer formed by sputtering, a conductive printing layer formed by printing, or a conductive electroplating layer formed by electroplating etc., according to different requirements, but it is merely an example and is not meant to limit the instant disclosure.

More precisely, the substrate unit 1 includes a plurality of first half through holes 121 disposed on the outer surrounding peripheral surface 100 of the circuit substrate 10 and passing through the circuit substrate 10, and the package unit 3 includes a plurality of second half through holes 122 passing through the package gel body 30 and respectively communicated with the first half through holes 121. The second end 1302 of each inner conductive layer 130 is exposed from the corresponding first half through hole 121, and the inner surfaces of the first half through holes 121 and the inner surfaces of the second half through holes 122 are covered with the metal shielding layer 40. In addition, the package gel body 30 has an outer surrounding peripheral surface 300, the outer surrounding peripheral surface 300 of the package gel body 30 and the outer surrounding peripheral surface 100 of the circuit substrate 10 are cutting surfaces, and the outer surrounding peripheral surface 300 of the package gel body 30 are flushed with the outer surrounding peripheral surface 100 of the circuit substrate 10.

[Second Embodiment]

Figure 11:
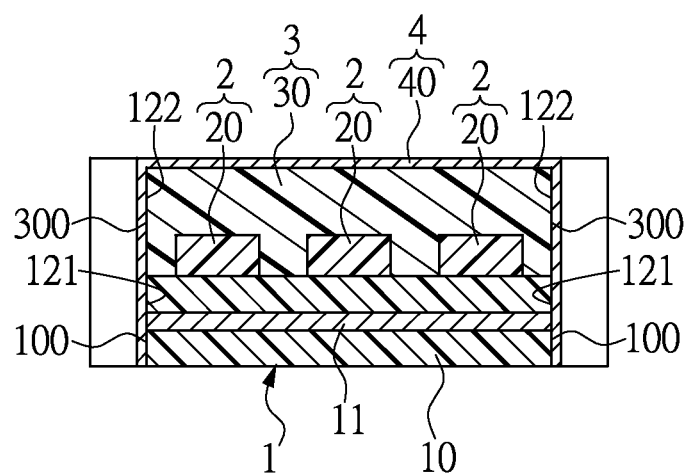
FIG. 11 shows a cross-sectional, schematic view of the module IC package structure with electrical shielding function according to the second embodiment of the instant disclosure.

Referring to FIG. 11, the second embodiment of the instant disclosure provides a module IC package structure Z with electrical shielding function, comprising: a substrate unit 1, an electronic unit 2, a package unit 3 and a shielding unit 4. Comparing FIG. 11 with FIG. 9, the difference between the second embodiment and the first embodiment is as follows: in the second embodiment, the substrate unit 1 includes a circuit substrate 10 having an outer surrounding peripheral surface 100 and a grounding layer 11 disposed inside the circuit substrate 10, and the terminal end of the grounding layer 11 is directly exposed from the outer surrounding peripheral surface 100 of the circuit substrate 10 (i.e., the terminal end of the grounding layer 11 is directly exposed from the first half through holes 121 of the circuit substrate 10), thus the metal shielding layer 40 can directly contact the grounding layer 11 that has been exposed from the outer surrounding peripheral surface 100 of the circuit substrate 10, and the electronic components 20 can be electrically connected to the metal shielding layer 40 directly through the grounding layer 11.

In conclusion, referring to FIG. 9, as shown in the first embodiment, the grounding layer 11 is electrically connected to the metal shielding layer 40 through the inner conductive layers 130 of the inner conductive structure 13. However, referring to FIG. 11, as shown in the second embodiment, the grounding layer 11 can directly contact the metal shielding layer 40 without any conductive medium.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A module IC package structure, comprising:
    a substrate unit including a circuit substrate having an outer surrounding peripheral surface, a grounding layer disposed inside the circuit substrate and enclosed by the circuit substrate, and an inner conductive structure disposed inside the circuit substrate and electrically connected to the grounding layer, wherein the inner conductive structure includes a plurality of inner conductive layers, and each inner conductive layer has a first end directly contacting the grounding layer and a second end opposite to the first end and exposed from the outer surrounding peripheral surface of the circuit substrate;
    an electronic unit including a plurality of electronic components disposed on the circuit substrate and electrically connected to the circuit substrate, wherein the electronic components are electrically connected to the grounding layer through the circuit substrate;
    a package unit including a package gel body disposed on the circuit substrate to enclose the electronic components; and
    a shielding unit including a metal shielding layer disposed on the outer surface of the package gel body and the outer surrounding peripheral surface of the circuit substrate, wherein the metal shielding layer directly contacts the second end of each inner conductive layer, and the grounding layer is electrically connected to the metal shielding layer through the inner conductive structure;
    wherein the substrate unit includes a plurality of first half through holes disposed on the outer surrounding peripheral surface of the circuit substrate and passing through the circuit substrate, and the package unit includes a plurality of second half through holes passing through the package gel body and respectively communicated with the first half through holes.

2. The module IC package structure of claim 1, wherein the second end of each inner conductive layer is exposed from the corresponding first half through hole, and the inner surfaces of the first half through holes and the inner surfaces of the second half through holes are covered with the metal shielding layer.

3. The module IC package structure of claim 2, wherein the package gel body has an outer surrounding peripheral surface, the outer surrounding peripheral surface of the package gel body and the outer surrounding peripheral surface of the circuit substrate are cutting surfaces, and the outer surrounding peripheral surface of the package gel body are flushed with the outer surrounding peripheral surface of the circuit substrate.

4. A module IC package structure, comprising:
    a substrate unit including a circuit substrate having an outer surrounding peripheral surface and a grounding layer disposed inside the circuit substrate, wherein the grounding layer is exposed from the outer surrounding peripheral surface of the circuit substrate;
    an electronic unit including a plurality of electronic components disposed on the circuit substrate and electrically connected to the circuit substrate, wherein the electronic components are electrically connected to the grounding layer through the circuit substrate;
    a package unit including a package gel body disposed on the circuit substrate to enclose the electronic components; and
    a shielding unit including a metal shielding layer disposed on the outer surface of the package gel body and the outer surrounding peripheral surface of the circuit substrate, wherein the metal shielding layer directly contacts the grounding layer that is exposed from the outer surrounding peripheral surface of the circuit substrate, and the electronic components are electrically connected to the metal shielding layer through the grounding layer;
    wherein the substrate unit includes a plurality of first half through holes disposed on the outer surrounding peripheral surface of the circuit substrate and passing through the circuit substrate, and the package unit includes a plurality of second half through holes passing through the package gel body and respectively communicated with the first half through holes.

5. The module IC package structure of claim 4, wherein the grounding layer is exposed from the first half through holes, and the inner surfaces of the first half through holes and the inner surfaces of the second half through holes are covered with the metal shielding layer.

6. The module IC package structure of claim 5, wherein the package gel body has an outer surrounding peripheral surface, the outer surrounding peripheral surface of the package gel body and the outer surrounding peripheral surface of the circuit substrate are cutting surfaces, and the outer surrounding peripheral surface of the package gel body are flushed with the outer surrounding peripheral surface of the circuit substrate.

7. A module IC package structure, comprising:
a substrate unit including a circuit substrate having an outer surrounding peripheral surface and a grounding layer disposed inside the circuit substrate, wherein the grounding layer is exposed from the outer surrounding peripheral surface of the circuit substrate;
an electronic unit including a plurality of electronic components disposed on the circuit substrate and electrically connected to the circuit substrate, wherein the electronic components are electrically connected to the grounding layer through the circuit substrate;
a package unit including a package gel body disposed on the circuit substrate to enclose the electronic components; and
a shielding unit including a metal shielding layer disposed on the outer surface of the package gel body and the outer surrounding peripheral surface of the circuit substrate, wherein the metal shielding layer directly contacts the grounding layer that is exposed from the outer surrounding peripheral surface of the circuit substrate, and the electronic components are electrically connected to the metal shielding layer through the grounding layer;
wherein the substrate unit includes a plurality of first half through holes disposed on the outer surrounding peripheral surface of the circuit substrate and passing through the circuit substrate, the package unit includes a plurality of second half through holes passing through the package gel body and respectively communicated with the first half through holes, the grounding layer is exposed from the first half through holes, and the inner surfaces of the first half through holes and the inner surfaces of the second half through holes are covered with the metal shielding layer.

* * * * *